(12) United States Patent  
Sun et al.

(10) Patent No.: US 8,213,131 B2  
(45) Date of Patent: Jul. 3, 2012

(54) READ SENSORS WITH IMPROVED ORIENTATION OF THE HARD BIAS LAYER AND HAVING A NANOCRYSTALLINE SEED LAYER

(75) Inventors: Yongjian Sun, San Jose, CA (US); Brian R. York, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1036 days.

(21) Appl. No.: 12/166,126

(22) Filed: Jul. 1, 2008

(65) Prior Publication Data

US 2010/0002336 A1 Jan. 7, 2010

(51) Int. Cl.  
*G11B 5/39* (2006.01)

(52) U.S. Cl. .................................. 360/324.12

(58) Field of Classification Search ............. 360/324.1, 360/324.11, 324.12, 324.2  
See application file for complete search history.

(56) References Cited

U.S. PATENT DOCUMENTS

| | | | |
|---|---|---|---|
| 5,748,416 A | 5/1998 | Tobise et al. ................. 360/113 |
| 6,055,135 A | 4/2000 | Fukamichi et al. ............ 360/113 |
| 6,185,081 B1 | 2/2001 | Simion et al. .............. 360/327.3 |
| 6,353,318 B1 | 3/2002 | Sin et al. ..................... 324/252 |
| 6,542,343 B1 | 4/2003 | Gill ........................... 360/324.2 |
| 6,668,443 B2* | 12/2003 | Chien et al. ................ 29/603.18 |
| 6,870,718 B2 | 3/2005 | Takahashi et al. ......... 360/327.3 |
| 7,035,061 B2 | 4/2006 | Singleton et al. ........ 360/324.12 |
| 7,251,110 B2* | 7/2007 | Lee et al. ................... 360/324.1 |
| 7,252,852 B1 | 8/2007 | Parkin ............................ 427/131 |
| 7,336,454 B2 | 2/2008 | Fukuzawa et al. ....... 360/324.12 |
| 7,639,457 B1* | 12/2009 | Chen et al. ............... 360/324.11 |
| 7,675,715 B2* | 3/2010 | Arasawa et al. ............. 360/319 |
| 7,804,668 B2* | 9/2010 | Zhou et al. ............... 360/324.12 |
| 2005/0174704 A1* | 8/2005 | Lin et al. .................. 360/324.12 |
| 2006/0039092 A1 | 2/2006 | Gill ........................... 360/324.2 |
| 2006/0279881 A1 | 12/2006 | Sato ......................... 360/324.12 |
| 2006/0279882 A1 | 12/2006 | Honda et al. ............. 360/324.12 |
| 2007/0091514 A1* | 4/2007 | Freitag et al. ............ 360/324.12 |
| 2007/0091675 A1 | 4/2007 | Hou et al. .................... 365/173 |
| 2007/0253123 A1* | 11/2007 | Freitag et al. ............ 360/324.12 |
| 2009/0103215 A1* | 4/2009 | Freitag et al. ............ 360/324.12 |
| 2011/0235216 A1* | 9/2011 | Lin ............................... 360/324 |

FOREIGN PATENT DOCUMENTS

JP 2008-34784 2/2008

* cited by examiner

*Primary Examiner* — Jefferson Evans  
(74) *Attorney, Agent, or Firm* — Zilka-Kotab, PC

(57) ABSTRACT

A system in one embodiment includes a magnetic sensor having a free magnetic layer, a nanocrystalline seed layer formed on an insulative amorphous material; a chromium-containing underlayer formed on the seed layer; and a hard bias layer formed on the underlayer and separated from the sensor by the insulative amorphous material. A method according to a further embodiment includes forming an amorphous insulative layer encapsulating a sensor stack; forming a nanocrystalline seed layer on the amorphous insulative material; forming a chromium-containing underlayer on the seed layer; and forming a hard bias layer on the underlayer. Additional systems and methods are presented.

25 Claims, 9 Drawing Sheets

READ SENSORS WITH IMPROVED ORIENTATION OF THE HARD BIAS LAYER AND HAVING A NANOCRYSTALLINE SEED LAYER

FIELD OF THE INVENTION

The present invention relates to magnetic sensors, and more particularly, this invention relates to improving the orientation of the hard bias layer in read sensors.

BACKGROUND OF THE INVENTION

A read head sensor is generally formed by thin film processing as shown in a front plane view as seen from the Air Bearing Surface (ABS) in FIGS. 1-2B, which show examples of a current perpendicular-to-plane (CPP) sensor. The two prime candidates for CPP sensors use tunneling magnetoresistance (TMR) as in FIG. 2B, or CPP-GMR as in FIG. 2A, the latter being most similar to in physical mechanism to CIP-GMR devices.

As shown in FIG. 1, a sensor 12 is positioned between two longitudinal bias structures 14, the bias structures being positioned outside track edges 16 of the sensor. With continued reference to FIG. 1, each bias structure 14 includes a layer of hard bias material 18 which provides a longitudinal bias field to the free layer of the sensor 12 for stabilizing the free layer magnetization. Illustrative thicknesses of the hard bias layers 18 are 50-200 Å and exemplary materials from which the hard bias layers 18 may be formed include CoPt, CoPtCr, etc. Each hard bias layer 18 is sandwiched between a pair of electrically insulative layers (IL1), (IL2) 20, 22. Preferred materials from which the insulative layers 20, 22 can be formed include $Al_2O_3$ or other dielectric material.

The sensor 12 can be a standard sensor 12 of any type but having a pinned layer structure. Illustrative sensor structures are shown in FIGS. 2A and 2B. In CPP sensors, the shields 24, 26 also serve as current leads.

With continued reference to FIG. 1, in the CPP sensor case (TMR or CPP GMR), both hard bias layers 18 are separated from sensor stack 12 by a dielectric layer 20 on either side. The free layer material is very soft magnetically with very low coercivity. It therefore easily falls into a multidomain state. It is desirable however that the magnetization of the free layer be biased uniformly throughout the entire layer. The preferred biased direction is parallel to the ABS as called the quiescent state for a read sensor without magnetic field signals from the rotating magnetic disk. The hard bias layers maintain the single-domain state in the free layer. The magnetic biasing field provided by the bias film must be sufficiently high to achieve stabilization and stable to maintain its magnetization in the presence of high magnetic flux from the media FIG. 2A depicts an ABS view of a CPP GMR sensor 30. "CPP" means that the sensing current ($I_s$) flows from one shield to the other shield in a direction perpendicular to the plane of the layers forming the sensor 30.

As shown in FIG. 2A, a first shield layer (S1) 24 is formed on a substrate (not shown). The first shield layer 24 can be of any suitable material, such as permalloy (NiFe).

Seed layers 32-36 are formed on the first shield layer 24. The seed layers aid in creating the proper growth structure of the layers above them, and also separate the microstructural influences from the underlying shield layer 24. Illustrative materials formed in a stack from the first shield layer 24 are a layer of Ta 32, a layer of NiFeCr 34, and a layer NiFe 36. Note that the stack of seed layers can be varied, and layers may be added or omitted based on the desired processing parameters.

An antiferromagnetic layer (AFM) 38, or antiferromagnet, is formed above the seed layers. The antiferromagnetic layer 38 pins the magnetization orientation of any overlying adjacent ferromagnetic layer.

Then an artificial antiferromagnetic layer, typically an antiparallel (AP) pinned layer structure 40, is formed above the seed layers. As shown in FIG. 2A, first and second AP pinned magnetic layers, (AP1-S) and (AP2-S/REF) 42, 44, are separated by a thin layer of an antiparallel coupling (APC-S) material 46 (typically Ru) such that the magnetic moments of the AP pinned layers 42, 44 are strongly self-coupled antiparallel to each other. AP-pinned layer 42 is exchange pinned by the AFM layer 38. AP-pinned layer 44 serves as the reference layer. In the embodiment shown in FIG. 2A, the preferred magnetic orientation of the pinned layers 42, 44 is for the first pinned layer 42, into the face of the structure depicted (perpendicular to the ABS of the sensor 24), and out of the face for the second pinned layer 44. Note that this orientation is canted in some embodiments. Illustrative materials for the pinned layers 42, 44 are $CoFe_{10}$ (100% Co, 10% Fe), $CoFe_{50}$ (50% Co, 50% Fe), etc. separated by a Ru layer 46.

With continued reference to FIG. 2A, a spacer layer (SP1-S) 48 is formed above the pinned layer structure 40. A spacer layer typically is made of a non-magnetic metal layer. Illustrative materials for a conductive spacer layer 48 include Cu, $CuO_x$, $Cu/CoFeO_x/Cu$ stack, etc.

FIG. 2B has a non-metallic tunnel barrier spacer layer 90. Illustrative materials for a tunnel barrier layer 90 include alumina and other oxides.

A free layer (FL-S) 50 is formed above the first spacer layer 48. Though nominally stabilized in a substantially longitudinal orientation by the hard-bias structure 14, the magnetization of the free layer 50 remains susceptible to modest reorientation from external transverse magnetic fields, such as those exerted by data recorded on disk media. The relative motion of magnetic orientation of the free layer 50 when affected by data bits on disk media creates variations in the electrical resistance of the sensor 24, thereby creating the signal. Particularly, the current flow through the sensor stack is maximized (or minimized) when the free layer 50 is parallel (or antiparallel) to the adjacent pinned (reference) layer 44. Exemplary materials for the free layer 50 are CoFe/NiFe stack, etc. An illustrative thickness of the free layer 50 is about 10-40 Å. Note that some embodiments may deliberately cant the nominal bias-point orientation of the free layer magnetization to moderately deviate from the longitudinal direction.

The free and reference layers can each be formed of a single layer, a laminate of layers, etc.

A cap (CAP) 52 can be formed above the free layer 50. Exemplary materials for the cap 52 are Ta, Ta/Ru stack, etc. An illustrative thickness range of the cap 52 is 20-60 Å.

Insulating layers (IL) 738 are formed adjacent the stack to isolate it from the hard bias layers 18. A second shield layer (S2) 26 is formed above the cap 52.

Read sensors in general, and the free layer of read sensors specifically, are aligned by the orientation of the hard bias layer. Therefore, the orientation of the hard bias layer is critical to the operation and effectiveness of hard bias and, by extension, the performance of the read sensor. The seed layer of a hard bias layer stack plays one of the most important roles in determining orientation. In the case of cobalt-platinum (CoPt) hard bias layers, the preferred orientation (11-20) is with the c-axis parallel to the layer surface and in alignment with the free layer. As a prior art, nickel-tantalum (NiTa) and other materials were used as a seed layer to provide a good initial growth surface and chromium molybdenum (CrMo) is used as an underlayer to provide an expitaxial texture for CoPt growth.

Normally CrMo has a mixture of (200) and (110) orientations above the NiTa. CrMo (200) is the desired orientation such that the lattice mismatch with CoPt (11-20) is minimized. For CoPt orientation, face-centered cubic (fcc) CoPt is not desired because of its poor magneto-anisotropy. Comparatively, CoPt (10-11) is not as good as CoPt (11-20) because CoPt (10-11) is 28.1° away from the plane of the thin film. The more in-plane the orientation of the CoPt film, the better the anisotropy and performance of hard bias.

Therefore, it would be favorable to have a process by which the orientation of the hard bias layer, and thus sensor stability and effectiveness, is improved.

SUMMARY OF THE INVENTION

A system in one embodiment includes a magnetic sensor having a free magnetic layer, a nanocrystalline seed layer formed on an insulative amorphous material; a chromium-containing underlayer formed on the seed layer; and a hard bias layer formed on the underlayer and separated from the sensor by the insulative amorphous material.

A system in one embodiment includes a current-perpendicular-to-plane (CPP) sensor, comprising a metallic seed layer, a pinning layer, an artificial antiferromagnetic layer, a spacer layer, a free magnetic layer, and a cap layer; a nanocrystalline seed layer formed along sides of the sensor stack and extending horizontally away therefrom, the seed layer being electrically insulative; a chromium-containing underlayer preferably epitaxially formed on the seed layer; and a hard bias layer preferably epitaxially formed on the underlayer.

A method according to a further embodiment includes forming an amorphous insulative layer encapsulating a sensor stack; forming a nanocrystalline seed layer on the amorphous insulative material; forming a chromium-containing underlayer on the seed layer; and forming a hard bias layer on the underlayer.

A method in yet another embodiment includes forming a nanocrystalline seed layer along sides of a sensor stack and extending horizontally away therefrom, the seed layer being electrically insulative; epitaxially forming a chromium-containing underlayer on the seed layer; and epitaxially forming a hard bias layer on the underlayer.

Other aspects and embodiments of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

Figure 1:
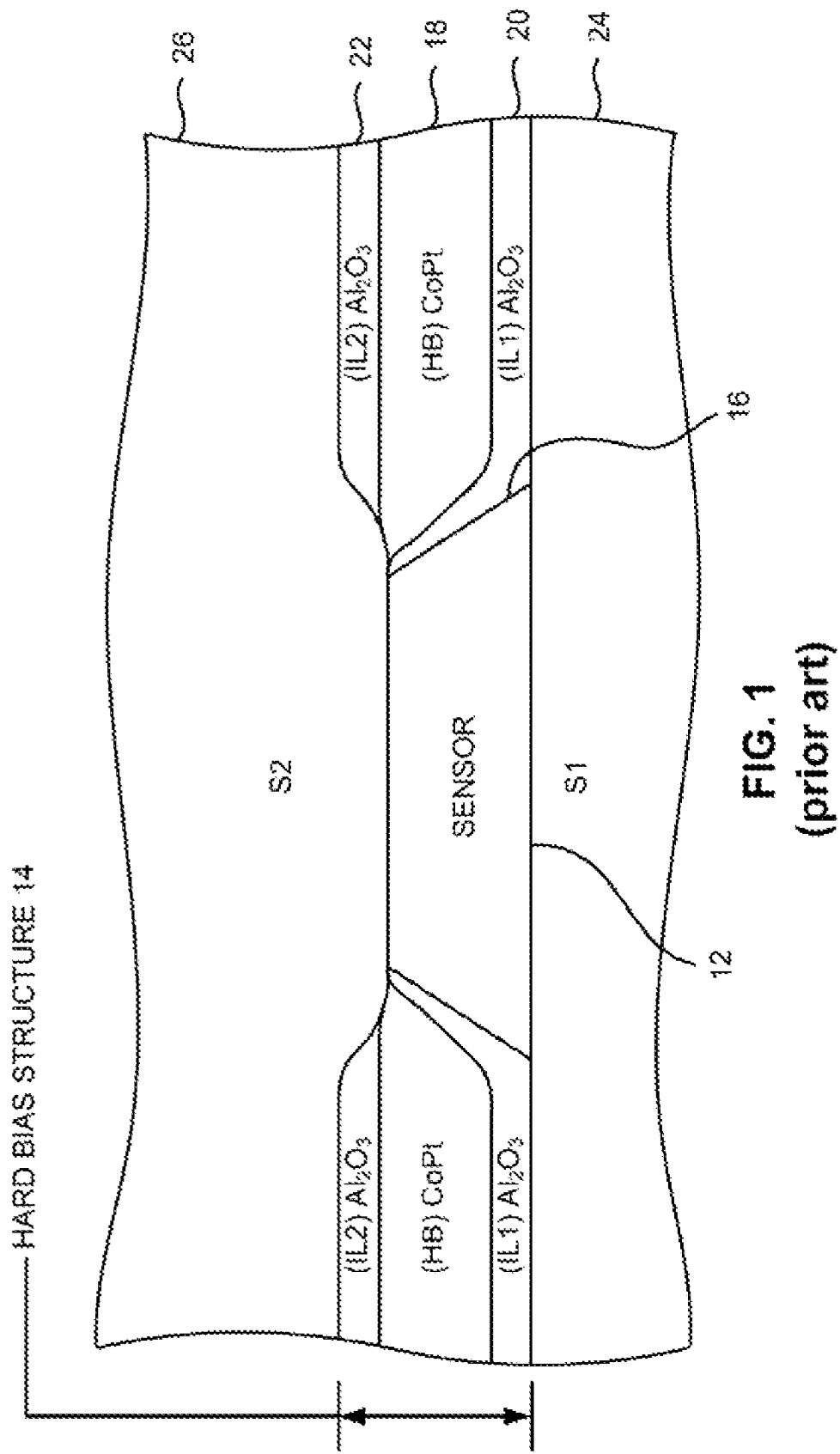
FIG. 1 is an ABS illustration of a sensor structure, not to scale.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

The following description discloses several preferred embodiments of thin film systems and methods of production thereof.

In one general embodiment, a system comprises a nanocrystalline seed layer formed on an amorphous material; a chromium-containing underlayer epitaxially formed on the seed layer; and a hard bias layer epitaxially formed on the underlayer.

In another general embodiment, a system comprises a sensor stack; a nanocrystalline seed layer formed along sides of the sensor stack and extending horizontally away therefrom, the seed layer being electrically insulative; a chromium-containing underlayer epitaxially formed on die seed layer; and a hard bias layer epitaxially formed on the underlayer.

In another general embodiment, a method comprises forming an amorphous layer towards a sensor stack; forming a nanocrystalline seed layer on the amorphous material; epitaxially forming a chromium-containing underlayer on the seed layer; and epitaxially forming a hard bias layer on the underlayer.

In another general embodiment, a method comprises forming a nanocrystalline seed layer along sides of a sensor stack and extending horizontally away therefrom, the seed layer being electrically insulative; epitaxially forming a chromium-containing underlayer on the seed layer; and epitaxially forming a hard bias layer on the underlayer.

Magnesium oxide (MgO) grown on top of amorphous materials has shown a preferred (200) orientation. Also, MgO's nanocrystallinity can be altered through post annealing, which provides more options for structural changes. MgO (200) is expected to provide a very suitable plane for chromium molybdenum (CrMo) epitaxial growth along the (200) orientation. In addition, MgO (110) mostly leads to CrMo (112) growth. For cobalt-platinum (CoPt) (10-10) texture, the c-axis is in the thin film plane, which is also beneficial for thin film production and operation. Therefore, MgO, when used as a seed layer, provides the preferred orientation for growth of CrMo and other chromium compounds such as CrW, CrTi, CrV, etc., and CoPt and other cobalt-platinum compounds such as CoPtCr, CoPtB, etc.

The hard bias seed layer will usually determine the hard bias characteristics such as squareness, retentivity, coercivity, and orientation (easy axis/hard axis retentivity ratio). CoPt (11-20) and (10-10) are the desired orientations because they both are in the same plane as the thin film. Such orientations should improve the read sensor stability through better alignment of the free layer. MgO, when used as the seed layer with either (200) or (110) orientations, and combined with Cr or other chromium compounds as the underlayer, provides the desired (200) or (110) orientations.

It has been found that the following epitaxial relations exist among MgO/Cr/CoPt, where MgO is a single crystal, or monocrystalline:

1) MgO(200)/Cr(200)/CoPt (11-20)
2) MgO(110)/Cr(112)/CoPt (10-10)

The inventors have found that a similar relationship exists for CrMo or CrTi when used as the underlayer in a nanocrystalline structure. Also, MgO thin film prepared through ion beam deposition or magneto sputtering (DC or RF) on an amorphous material shows the preferred orientations (200) or (110). With annealing, MgO can be highly oriented. This nanocrystalline plane can be used as the preferred nuclei growth sites for Cr growth at (200) or (112) orientations. MgO can be prepared by RF sputtering a MgO target, reactively DC sputtering a Mg target with oxygen ions, or ion beam sputtering of both MgO and Mg targets, or atomic layer deposition (ALD) using Bis(methylcyclopentadienyl) Magnesium [Mg(CH3-C5H4)2] or [Mg(C5H5)$_2$] as an example. Cr, CrMo, and CoPt can be deposited using sputtering and ion beam deposition.

Figure 3:
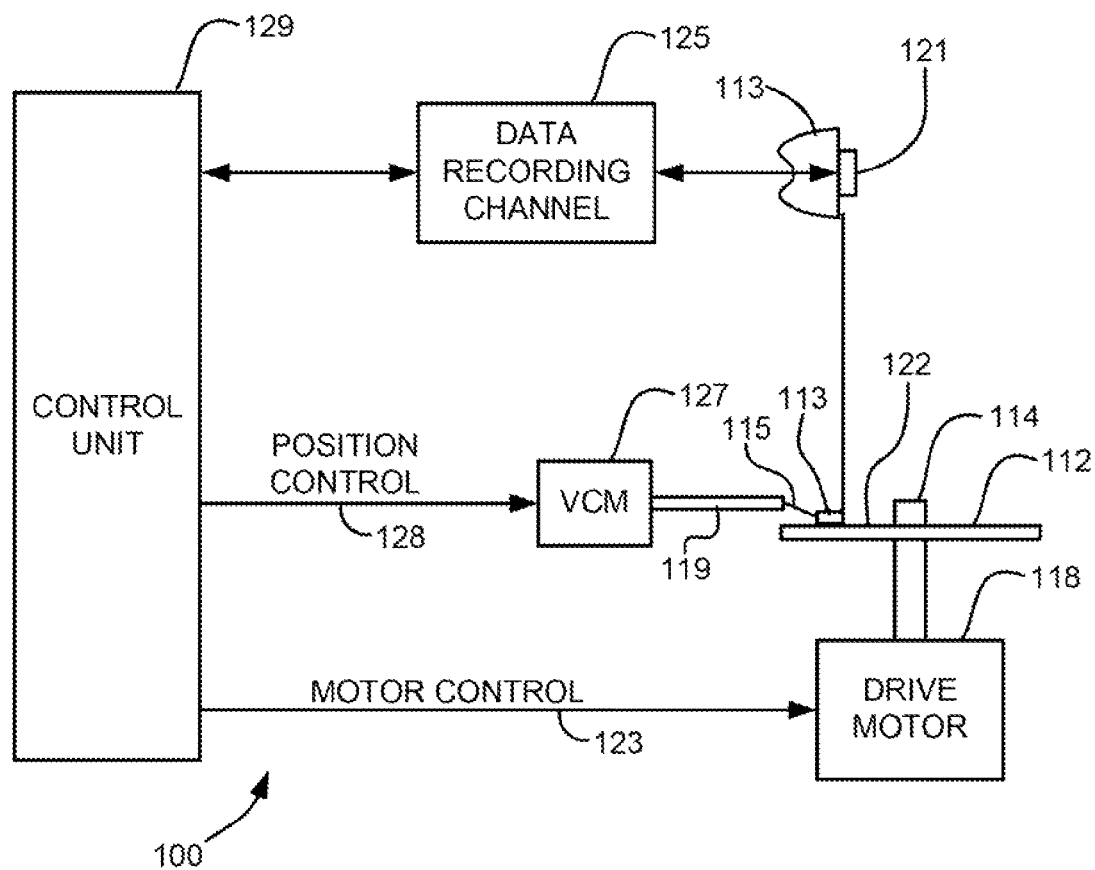
FIG. 3 is a simplified drawing of a magnetic recording disk drive system.

Referring now to FIG. 3, there is shown a disk drive 100 in accordance with one embodiment of the present invention. As shown in FIG. 3, at least one rotatable magnetic disk 112 is supported on a spindle 114 and rotated by a disk drive motor 118. The magnetic recording on each disk is in the form of an annular pattern of concentric data tracks (not shown) on the disk 112.

At least one slider 113 is positioned near the disk 112, each slider 113 supporting one or more magnetic read/write heads 121. As the disks rotate, slider 113 is moved radially in and out over disk surface 122 so that heads 121 may access different tracks of the disk where desired data are recorded. Each slider 113 is attached to an actuator arm 119 by means of a suspension 115. The suspension 115 provides a slight spring force which biases slider 113 against the disk surface 122. Each actuator arm 119 is attached to an actuator means 127. The actuator means 127 as shown in FIG. 3 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write heads 121 by way of recording channel 125.

The above description of a typical magnetic disk storage system and the accompanying illustration of FIG. 3 are for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write head includes a coil layer embedded in one or more insulation layers (insulation stack), the insulation stack being located between first and second pole piece layers. A gap is formed between the first and second pole piece layers by a gap layer at an air bearing surface (ABS) of the write head. The pole piece layers may be connected at a back gap. Currents are conducted through the coil layer, which produce magnetic fields in the pole pieces. The magnetic fields fringe across the gap at the ABS for the purpose of writing bits of magnetic field information in tracks on moving media, such as in circular tracks on a rotating magnetic disk.

The second pole piece layer has a pole tip portion which extends from the ABS to a flare point and a yoke portion which extends from the flare point to the back gap. The flare point is where the second pole piece begins to widen (flare) to form the yoke. The placement of the flare point directly affects the magnitude of the magnetic field produced to write information on the recording medium. Since magnetic flux decays as it travels down the length of the narrow second pole tip, shortening the second pole tip will increase the flux reaching the recording media. Therefore, performance can be optimized by aggressively placing the flare point close to the ABS.

Figure 2A:
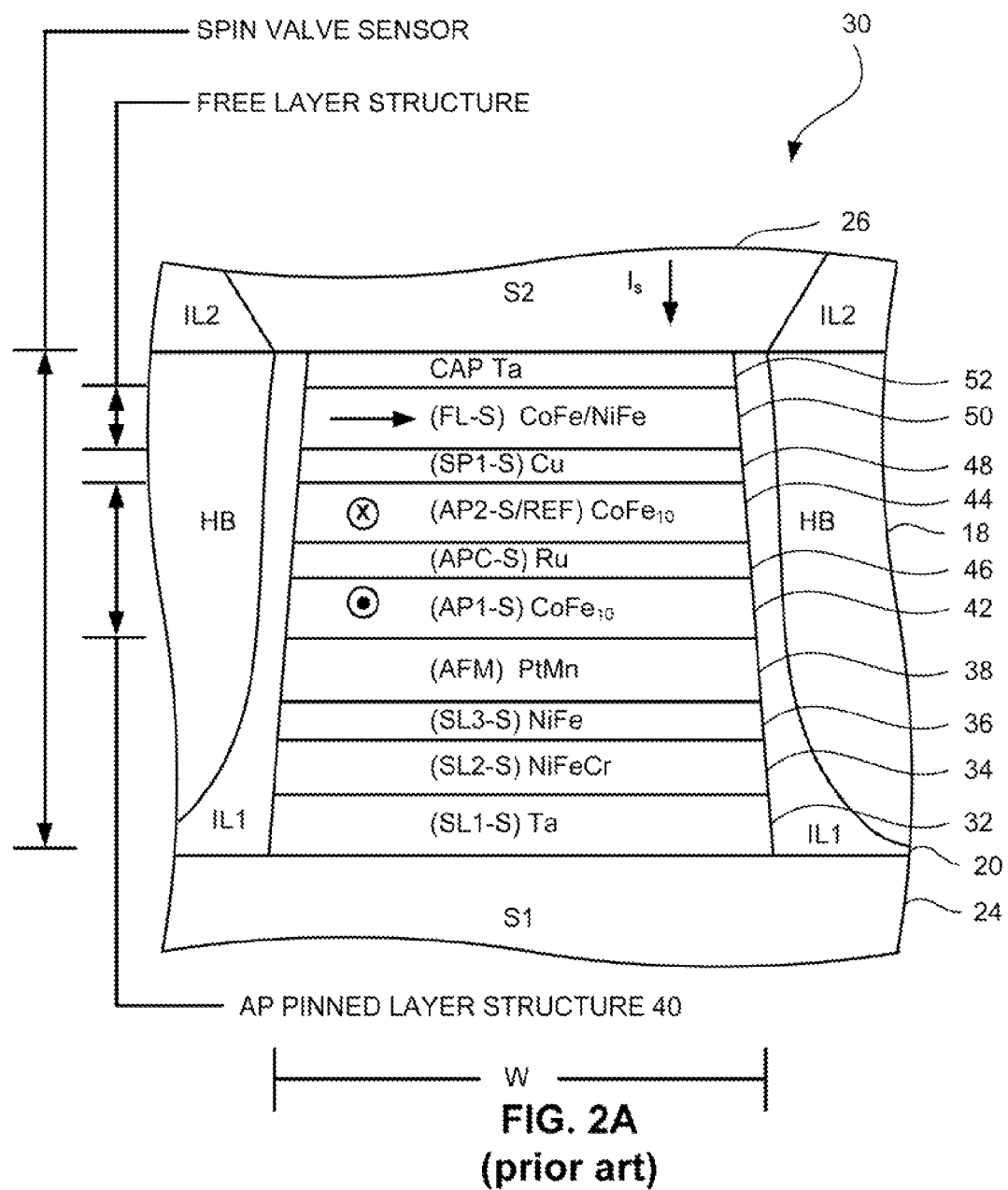
FIG. 2A is an ABS illustration of a CPP GMR sensor, not to scale.
Figure 2B:
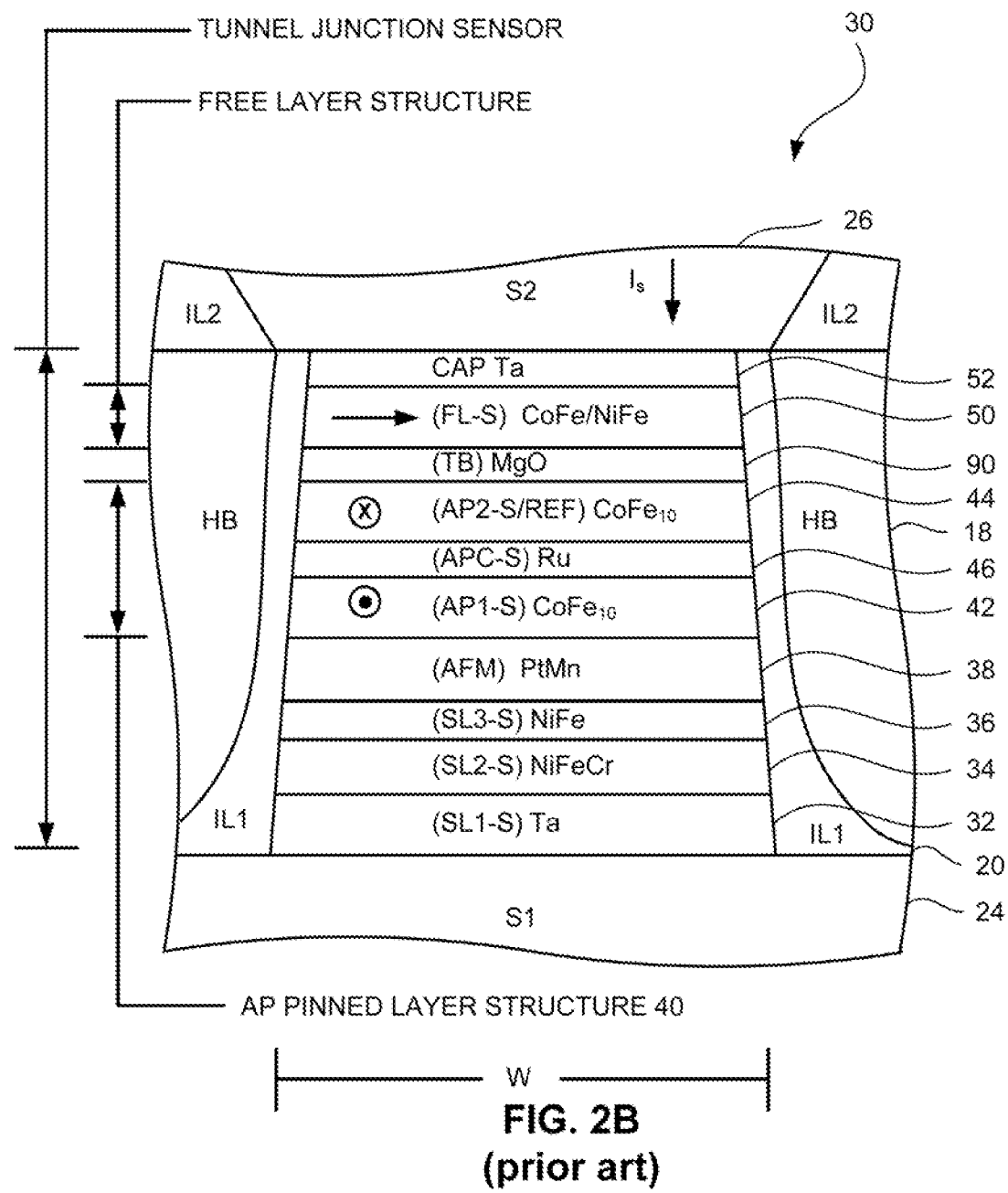
FIG. 2B is an ABS illustration of a CPP TMR sensor, not to scale.

Now referring to FIGS. 4A-4E, a number of steps are shown in the schematic diagrams illustrating a method for forming a read sensor with improved hard bias layer orientation according to one embodiment. This read sensor could be used in conjunction with a system like disk drive 100 shown in FIG. 3, and may have a sensor stack structure similar to that shown in FIG. 2A or 2B with similar or different layer ordering, additional and/or less layers; or a different structure.

Figure 4A:
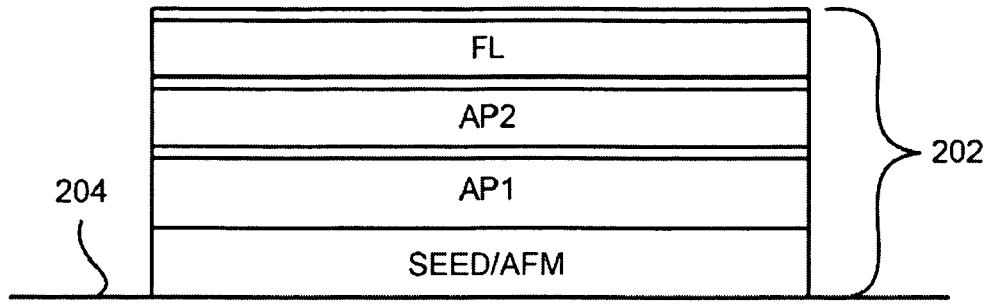
FIGS. 4A-4E are simplified drawings of steps in forming a read sensor with improved hard bias layer orientation according to one embodiment.

In FIG. 4A, layers of a thin film sensor stack 202 are formed above a substrate 204. The thin film sensor stack 202 may be comprised of any common materials used currently to make thin film sensor stacks. The substrate 204 may be of any common substrate material used in thin film processing. The thin film sensor stack 202 may be of any type, including a tunnel magnetoresistive (TMR) sensor and CPP giant magnetoresistive (GMR) sensor in particular.

Figure 4B:
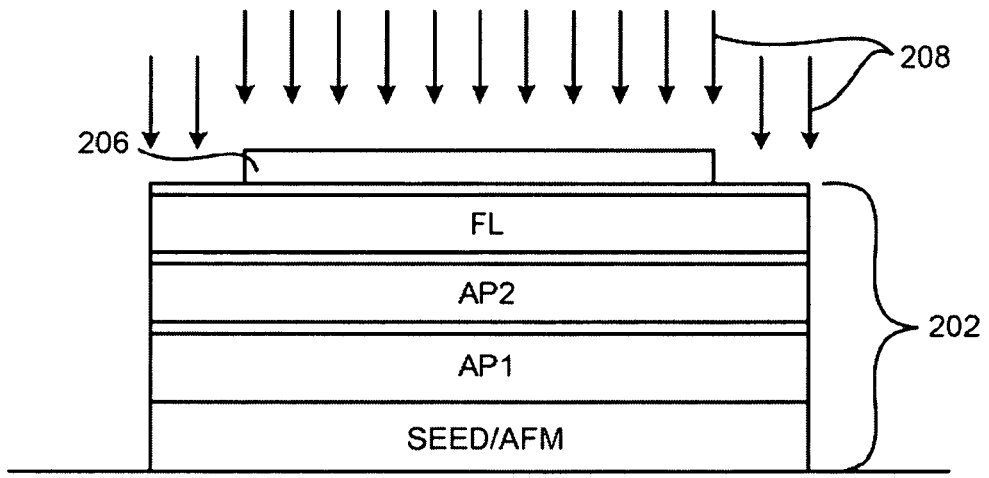

In FIG. 4B, a mask 206 is formed above the thin film sensor stack 202, where the mask 206 is formed to define the thin film sensor stack 202 after an etching process 208 removes the portions of the thin film sensor stack 202 which are not covered by the mask 206. The etching process 208 may be of any commonly used microfabrication technique, including reactive ion etching (RIE) or ion milling.

Figure 4C:
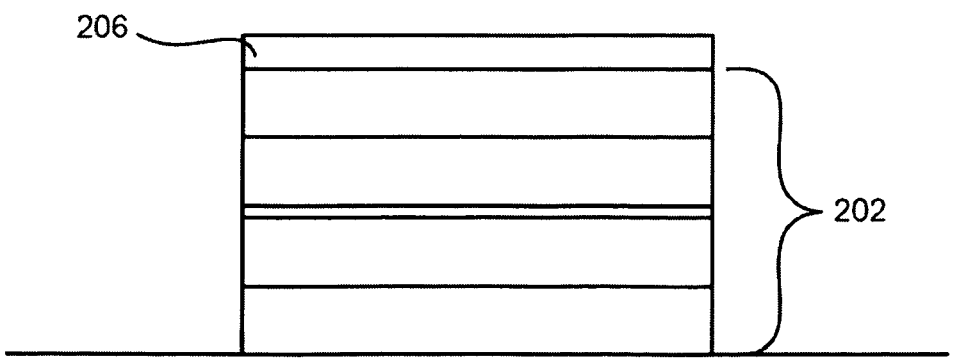

In FIG. 4C, the result of the etching process is shown, as the thin film sensor stack 202 has been reduced to the desired size and shape as determined by the size of the mask 204 placed above the thin film sensor stack 202.

Figure 4D:
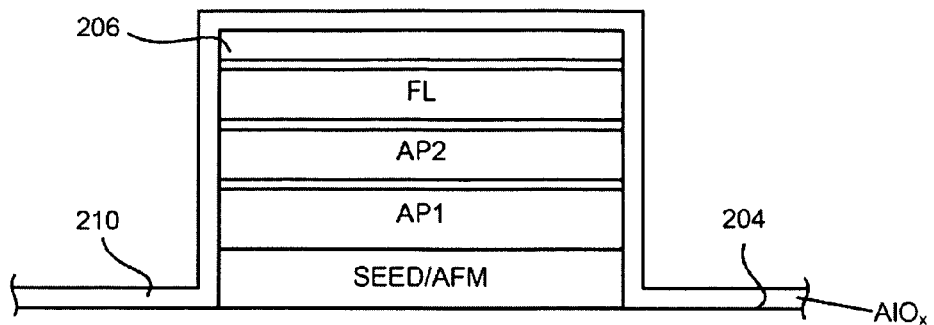

FIG. 4D shows an insulative layer 210 formed around the thin film sensor stack 202, and the substrate 204. This insulative layer 210 will encapsulate the sensor stack 202 from the surround. The insulative layer 210 may be comprised of alumina ($Al_2O_3$), silicon nitride ($Si_3N_4$) or any other suitable amorphous material. To properly control the thickness of the amorphous layer 210, atomic layer deposition (ALD) may preferably be used to form the amorphous layer 210, but any deposition technique may be used such as chemical vapor deposition (CVD), physical vapor deposition (PVD) including sputter coating and ion beam deposition, etc.

Figure 4E:
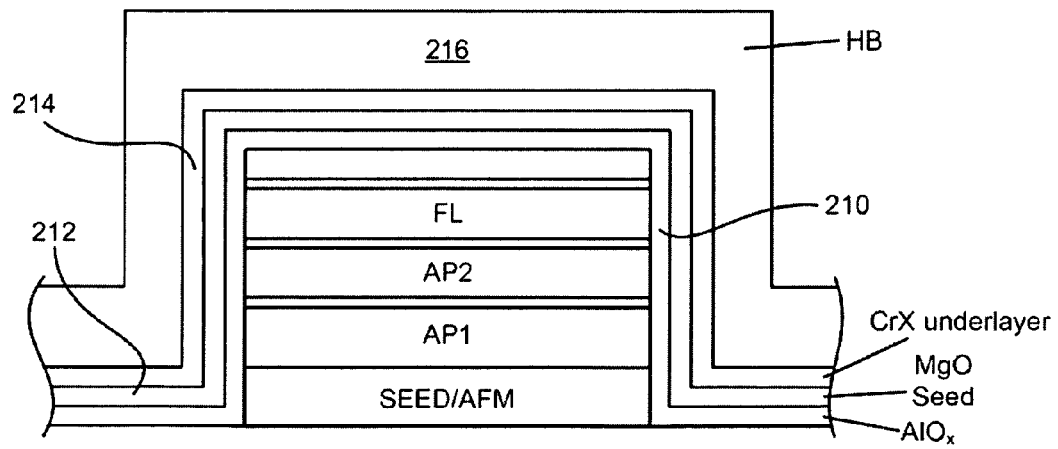

In FIG. 4E, more layers are added above the amorphous insulative layer 210. First, a seed layer 212 is formed. The seed layer 212 preferably has a nanocrystalline structure. The seed layer 212 may be formed through any deposition technique used in forming thin film layers. Next, an underlayer 214 is preferably epitaxially formed on the seed layer 212, where the underlayer 214 is comprised of Cr or a Cr containing compound. On the underlayer 214, a hard bias layer 216 is preferably epitaxially formed.

In other embodiments, the seed layer may be formed of MgO, AlN, or other suitable materials.

In another embodiment, the underlayer 214 may be selected from the group consisting of: CrX, where X includes nothing (i.e., Cr), or one or more of tungsten (W), molybdenum (Mo), Vanadium (V), and titanium (Ti).

In yet another embodiment, the hard bias layer 216 (HB) may be selected from a group consisting of CoPt and CoPtY, where Y includes at least one of Cr, boron (B), and nitrogen (N). In addition, N may be added to the hard bias layer 216.

In another approach, the seed layer 214 may undergo further processing, such as annealing in order to alter the nanocrystallinity thereof.

FIGS. 5A-5E illustrate a number of steps of a method for forming a read sensor with improved hard bias layer orientation according to one embodiment. This read sensor could be used in conjunction with a system like disk drive 100 shown in FIG. 3, and may have a sensor stack structure similar to that shown in FIG. 2A or 2B with similar or different layer ordering, additional and/or less layers; or a different structure.

Figure 5A:
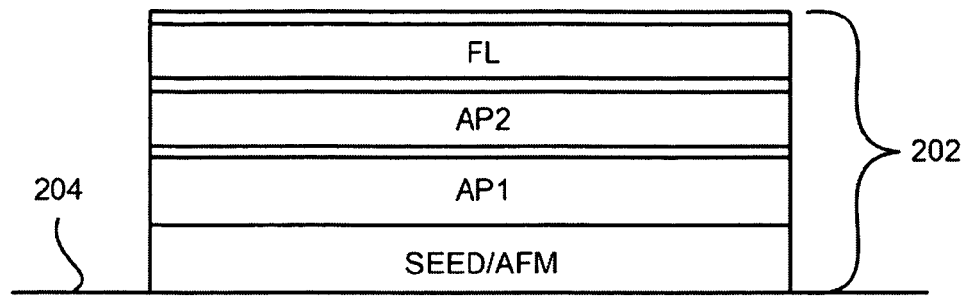
FIGS. 5A-5E are simplified drawings of steps in forming a read sensor with improved hard bias layer orientation according to one embodiment.

In FIG. 5A, layers of a thin film sensor stack 202 are formed above a substrate 204. The thin film sensor stack 202 may be comprised of any common materials used to make thin film sensor stacks. The substrate 204 may be of any common substrate material used in thin film processing. The thin film sensor stack 202 may be of any type, including a tunnel magnetoresistive (TMR) sensor, CPP giant magnetoresistive (GMR) sensor, etc.

Figure 5B:
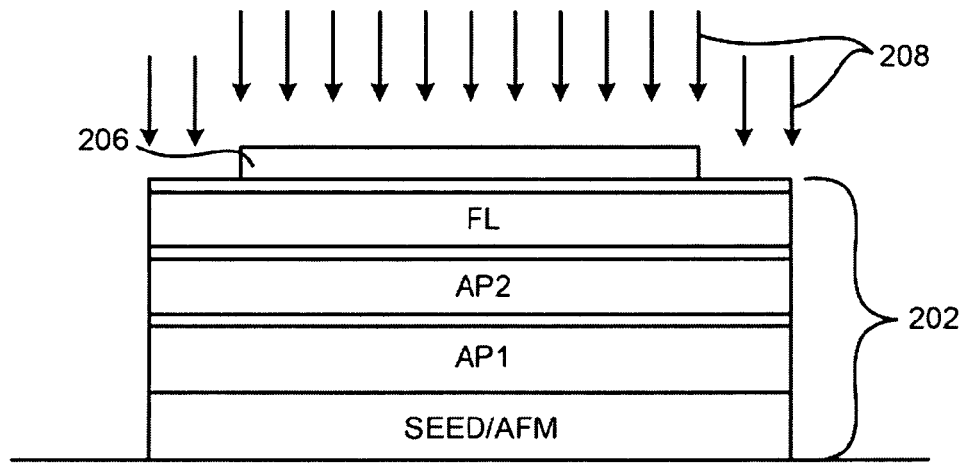

In FIG. 5B, a mask 206 is formed above the thin film sensor stack 202, where the mask 206 is formed to define the thin film sensor stack 202 after an etching process 208 removes the portions of the thin film sensor stack 202 which are not covered by the mask 206. The etching process 208 may be of any commonly used microfabrication technique, including reactive ion etching (RIE) and ion milling.

Figure 5C:
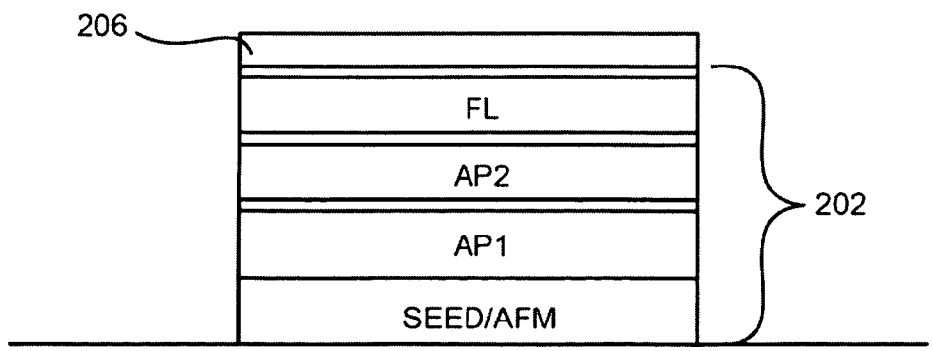

In FIG. 5C, the result of the etching process is shown, as the thin film sensor stack 202 has been reduced to the desired size and shape as determined by the size of the mask 204 placed above the thin film sensor stack 202.

Figure 5D:
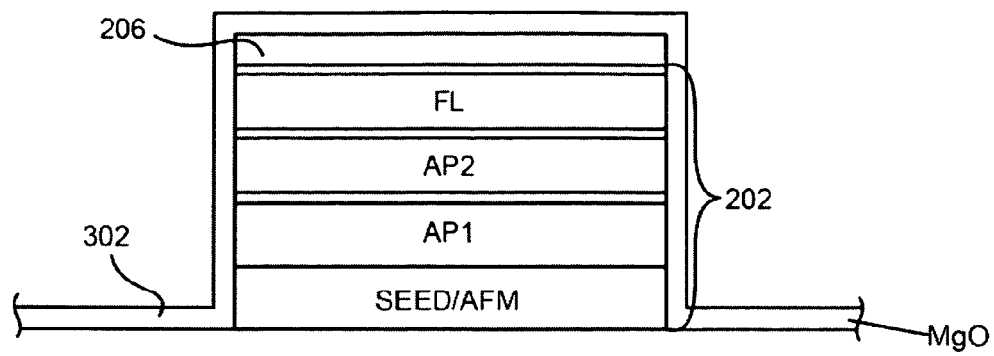

In FIG. 5D, a seed layer 302, preferably of insulative nanocrystalline structure, is formed along the sides of the thin film sensor stack 202 and extending horizontally away therefrom. The seed layer 302 is electrically insulative.

Figure 5E:
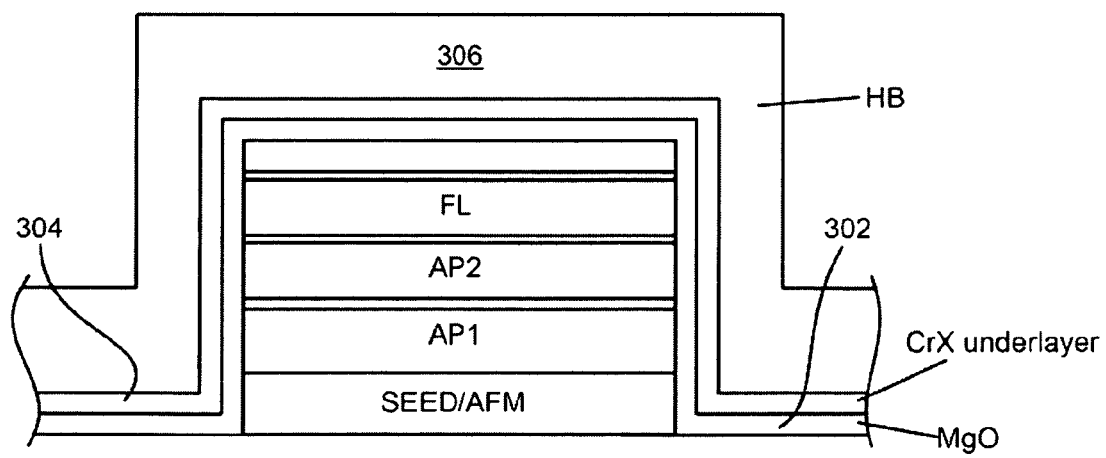

In FIG. 5E, a chromium-containing underlayer 304 is preferably epitaxially formed on the seed layer 302. Next, a hard bias layer 306 is preferably epitaxially formed on the underlayer 304.

In other embodiments, the seed layer 302 may be formed of MgO, or AlN, or other suitable insulative materials.

In one embodiment, the underlayer 304 may be selected from a group consisting of: Cr and CrX, where X includes at least one of W, Mo, V, and Ti.

In another embodiment, the hard bias layer 306 may be selected from a group consisting of CoPt and CoPtY, where Y includes at least one of Cr, B, and N. For example, CoPtY would include CoPtCr and CoPtCrB. In addition, N may be added to the hard bias layer 306.

In yet another embodiment, the seed layer 302 may undergo further processing, such as annealing in order to alter the nanocrystallinity thereof.

Figure 6:
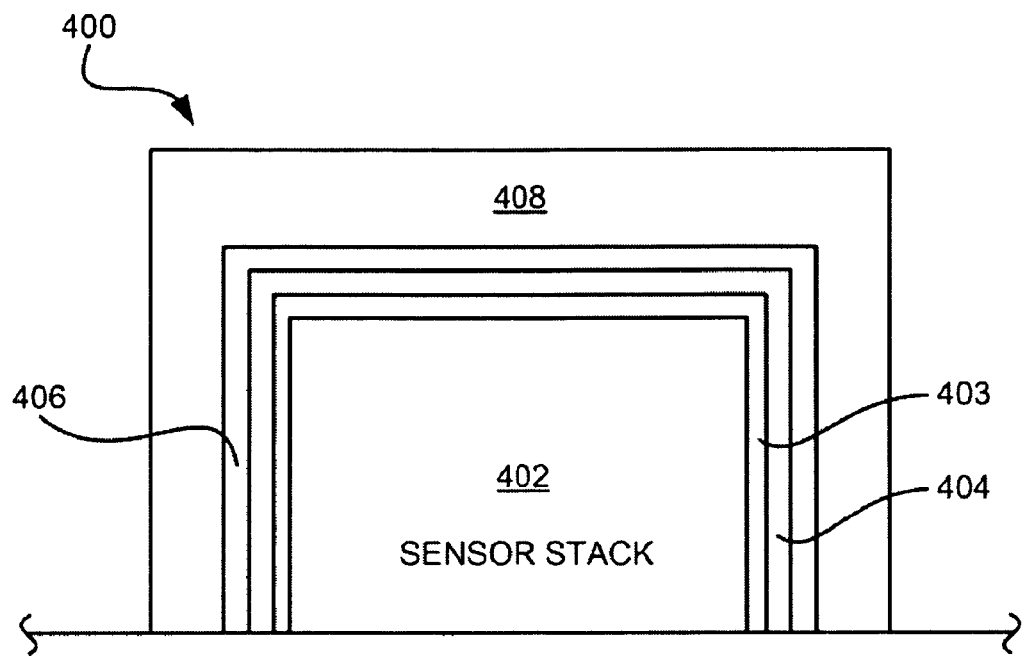
FIG. 6 is a schematic diagram of a system according to one embodiment.

Now referring to FIG. 6, a system 400 is shown which includes many aspects of the previously described methods. This system 400 could be used in conjunction with a system like disk drive 100 shown in FIG. 3. The system 400 comprises a nanocrystalline seed layer 404 which may be formed on a structure such as a sensor 402 covered by an amorphous insulative material 403. The seed layer 404 may be formed through any deposition technique used in forming thin film layers, such as sputter coating, ALD, PVD, etc. In addition, an underlayer 406 is preferably epitaxially formed on the seed layer 404, the underlayer 406 containing Cr or Cr compounds. On the underlayer 406, a hard bias layer 408 is preferably epitaxially formed.

In other embodiments, the seed layer 404 may be MgO, or AlN, or other suitable insulative materials.

In one embodiment, the underlayer 406 may be selected from a group consisting of: Cr and CrX, where X includes at least one of W, Mo, V, and Ti.

In another embodiment, the hard bias layer 408 may be selected from a group consisting of CoPt and CoPtY, where Y includes at least one of Cr, B, and N. For example, CoPtY would include CoPtCr and CoPtCrB. In addition, N may be added to the hard bias layer 408.

In yet another embodiment, the seed layer 404 may undergo further processing, such as annealing in order to alter the nanocrystallinity thereof.

Figure 7:
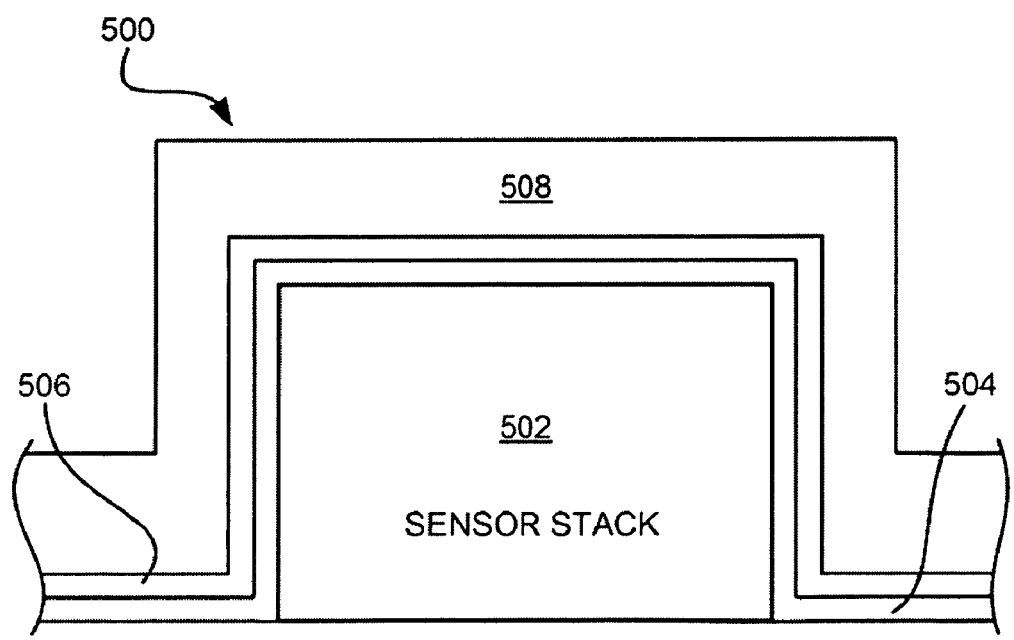
FIG. 7 is a schematic diagram of a system according to one embodiment.

Now referring to FIG. 7, a system 500 is shown, which could be used in conjunction with a system like disk drive 100 shown in FIG. 3. System 500 comprises a sensor stack 502, a nanocrystalline seed layer 504 formed along the sides of the sensor stack 502 and extending horizontally away therefrom, the seed layer 504 being electrically insulative, a chromium-containing, underlayer 506 preferably epitaxially formed on the seed layer 504, and a hard bias layer 508 preferably epitaxially formed on the underlayer 506. The seed layer 504 may be formed using any commonly used deposition techniques such as sputter coating, ALD, PVD, etc.

In other embodiments, the seed layer 504 may be MgO, or AlN, or other suitable insulative materials.

In one embodiment, the underlayer 506 may be selected from a group consisting of: Cr and CrX, where X includes at least one of W, Mo, V, and Ti.

In another embodiment, the hard bias layer 508 may be selected from a group consisting of CoPt and CoPtY, where Y includes at least one of Cr, B, and N. For example, CoPtY would include CoPtCr and CoPtCrB. In addition, N may be added to the hard bias layer 508.

In yet another embodiment, the system 500 may further comprise a cap layer formed above the hard bias layer 508. This cap layer may be of any material suitable for and commonly used for capping layers in thin film manufacturing.

For further explanatory purposes, an illustrative thickness of the hard bias layer for each embodiment is preferably in the range of about 20 nm to about 40 nm, but the actual thickness of the hard bias layer may be greater than 40 nm or less than 20 nm In addition, an illustrative thickness of the seed layer for each embodiment is preferably about 1.0 nm to about 10 nm, but the actual thickness of the seed layer may be greater than 10 nm. or less than 1.0 nm. Also, an illustrative thickness of the underlayer for each embodiment is preferably about 2.5 to about 5.0 nm, but the actual thickness of die underlayer may be greater than 5.0 nm or less than 2.5 nm. These ranges are for illustrative purposes only, and should not limit the invention in any way.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:
   a magnetic sensor having a free magnetic layer;
   a nanocrystalline seed layer formed on an insulative amorphous material;
   a chromium-containing underlayer formed on the seed layer; and
   a hard bias layer formed on the underlayer and separated from the sensor by the insulative amorphous material.

2. The system of claim 1, wherein the magnetic sensor is a current-perpendicular-to-plane (CPP) sensor.

3. The system of claim 1, wherein the seed layer is MgO.

4. The system of claim 1, wherein the seed layer is AlN.

5. The system of claim 1, wherein the underlayer is selected from a group consisting of: Cr and CrX, where X includes at least one of W, Mo, V, and Ti.

6. The system of claim 1, wherein the hard bias layer is selected from a group consisting of: CoPt and CoPtY, where Y includes at least one of Cr, B, and N.

7. The system of claim 1, further comprising a cap layer formed above the hard bias layer.

8. A system, comprising:
   a current-perpendicular-to-plane (CPP) sensor, comprising a metallic seed layer, a pinning layer, an artificial antiferromagnetic layer, a spacer layer, a free magnetic layer, and a cap layer;
   a nanocrystalline seed layer formed along sides of the sensor stack and extending horizontally away therefrom, the seed layer being electrically insulative;
   a chromium-containing underlayer preferably epitaxially formed on the nanocrystalline seed layer; and
   a hard bias layer preferably epitaxially formed on the underlayer.

9. The system of claim 8, wherein the seed layer is MgO.

10. The system of claim 8, wherein the seed layer is AlN.

11. The system of claim 8, wherein the underlayer is selected from a group consisting of: Cr and CrX, where X includes at least one of W, Mo, V, and Ti.

12. The system of claim 8, wherein the hard bias layer is selected from a group consisting of: CoPt and CoPtY, where Y includes at least one of Cr, B, and N.

13. The system of claim 8, further comprising a cap layer formed above the hard bias layer.

14. A method for forming the system of claim 8, the method comprising:
   forming the amorphous insulative layer encapsulating the sensor stack;
   forming the nanocrystalline seed layer on the amorphous insulative material;
   forming the chromium-containing underlayer on the seed layer; and
   forming the hard bias layer on the underlayer.

15. The method of claim 14, wherein the seed layer is consisting of MgO or AlN.

16. The method of claim 14, wherein the chromium-containing underlayer is epitaxially formed relative to the seed layer, wherein the hard bias layer is epitaxially formed relative to the underlayer.

17. The method of claim 14, wherein the underlayer is selected from a group consisting of: Cr and CrX, where X includes at least one of W, Mo, V, and Ti.

18. The method of claim 14, wherein the hard bias layer is selected from a group consisting of: CoPt and CoPtY, where Y includes at least one of Cr, B, and N.

19. The method of claim 14, further comprising annealing the seed layer for altering a nanocrystallinity thereof.

20. A method for forming the system of claim 8, the method comprising:
   forming the nanocrystalline seed layer along the sides of the sensor stack and extending horizontally away therefrom, the seed layer being electrically insulative;
   epitaxially forming the chromium-containing underlayer on the seed layer; and
   epitaxially forming the hard bias layer on the underlayer.

21. The method of claim 20, wherein the seed layer is consisting of MgO or AlN.

22. The method of claim 20, wherein the chromium-containing underlayer is epitaxially formed relative to the seed layer, wherein the hard bias layer is epitaxially formed relative to the underlayer.

23. The method of claim 20, wherein the underlayer is selected from a group consisting of: Cr and CrX, where X includes at least one of W, Mo, V, and Ti.

24. The method of claim 20, wherein the hard bias layer is selected from a group consisting of CoPt and CoPtY, where Y includes at least one of Cr, B, and N.

25. The method of claim 20, further comprising annealing the seed layer for altering a nanocrystallinity thereof.

* * * * *